(12) United States Patent
Crook et al.

(10) Patent No.: US 9,472,610 B2
(45) Date of Patent: Oct. 18, 2016

(54) SUBSTRATE

(71) Applicant: SPTS TECHNOLOGIES LIMITED, Newport (GB)

(72) Inventors: Katherine Crook, Gloucestershire (GB); Stephen R Burgess, Ebbw Vale (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 14/733,559

(22) Filed: Jun. 8, 2015

(65) Prior Publication Data

US 2015/0357398 A1  Dec. 10, 2015

(30) Foreign Application Priority Data

Jun. 10, 2014  (GB) .................................. 1410317.0

(51) Int. Cl.
| | | |
|---|---|---|
| *H01L 21/70* | (2006.01) | |
| *H01L 49/02* | (2006.01) | |
| *H01L 21/02* | (2006.01) | |
| *C23C 14/10* | (2006.01) | |
| *H01L 23/31* | (2006.01) | |
| *H01L 23/00* | (2006.01) | |

(52) U.S. Cl.
CPC ............... *H01L 28/40* (2013.01); *C23C 14/10* (2013.01); *H01L 21/02118* (2013.01); *H01L 21/02164* (2013.01); *H01L 21/02214* (2013.01); *H01L 21/02274* (2013.01); *H01L 23/3192* (2013.01); *H01L 23/562* (2013.01); *H01L 2924/0002* (2013.01)

(58) Field of Classification Search
CPC ................... H01L 21/02118; H01L 21/02164; H01L 21/02274; H01L 21/02214; H01L 23/3192; H01L 23/562
USPC ......................................... 257/374, 501, 506
See application file for complete search history.

(56) References Cited

U.S. PATENT DOCUMENTS

| | | | |
|---|---|---|---|
| 6,017,614 | A | 1/2000 | Tsai et al. |
| 6,426,285 | B1 | 7/2002 | Chen et al. |
| 2001/0023125 | A1 | 9/2001 | Nishimoto et al. |
| 2010/0139391 | A1 | 6/2010 | Sakuma |
| 2012/0034451 | A1 | 2/2012 | Seo et al. |

FOREIGN PATENT DOCUMENTS

| | | |
|---|---|---|
| EP | 0307099 A1 | 3/1989 |
| EP | 8051480 A2 | 7/1998 |
| JP | 2007183379 A | 7/2007 |
| JP | 2010098233 A | 4/2010 |
| WO | WO2006007313 A2 | 1/2006 |

OTHER PUBLICATIONS

Search Report from GB1410317.0 Dated Dec. 2, 2014.
(Continued)

*Primary Examiner* — Tan N Tran
(74) *Attorney, Agent, or Firm* — Volentine & Whitt, PLLC

(57) ABSTRACT

A substrate having a dielectric film thereon, in which: the dielectric film comprises at least four stacked layers of a dielectric material; the stacked layers comprise compressive layers which are subject to a compressive stress, and tensile layers which are subject to a tensile stress; and there are at least two spaced apart tensile layers which are each adjacent to one or more compressive layers.

26 Claims, 5 Drawing Sheets

(56) References Cited

OTHER PUBLICATIONS

Mackenzie, K.D., et al., "Stress Control of Si-Based PECVD Dielectric," 207th ECS Meeting, Abstract #406.

Mimoun, B., "Mechanical Study of Silicon Nitride Layrs on Thin Flexible Substrates Under Bending," pp. 95-98.

Yang, Jie, "A New Technique for Producing Large-Area as Deposited Zero-Stress LPCVD Polysilicon Films: The Multiploy Process," IEEE Journal of Microelectromechanical Systems, vol. 9, No. 4, Dec. 2000, pp. 485-494.

Mahajan Am et al:"Influence of process parameters on the properties of TEOS-PECVD-grown SiO2 films", Surface and Coatings Technology, Elsevier, Amsterdam, NL. vol. 188-189, Nov. 1, 2004, pp. 314-318, XP027184835, ISSN: 0257-8972.

Guan D et al: "Stress control of plasma enhanced chemical vapor deposited silicon oxide film from tetrathoxysilane", J. Micromech. Microeng., val. 24, 027001, Dec. 23, 2013, pp. 1-5, XP0027 45406.

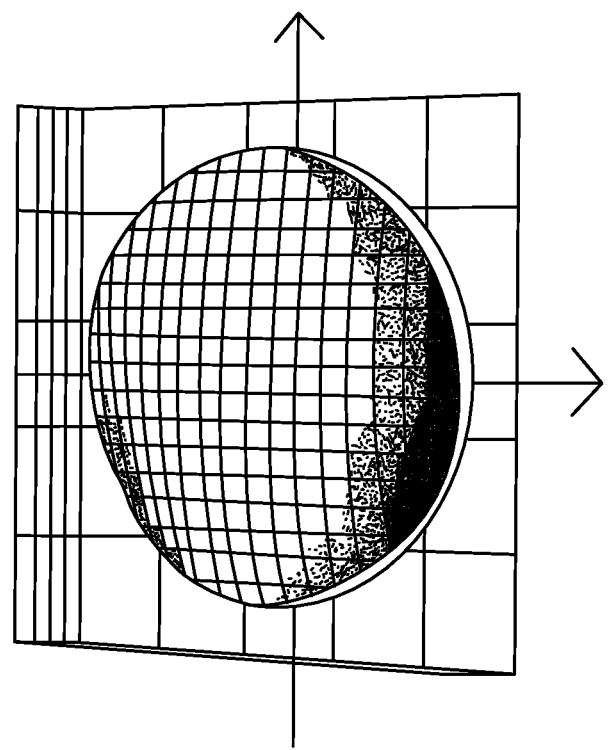
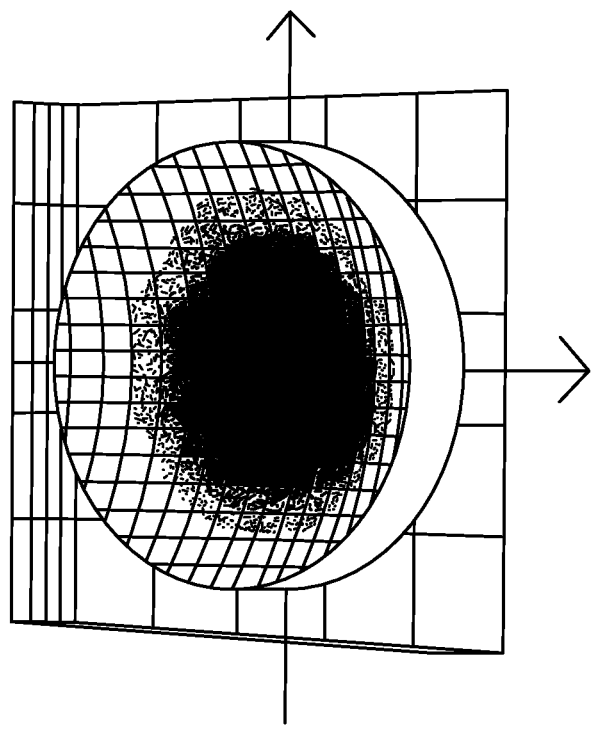
Fig. 2 a)

| Layer | 1 | 2 | 3 | 4 | 5 | 6 |
|---|---|---|---|---|---|---|
| Film Type | 4.0μm Comp TEOS | 2.0μm Tens TEOS | 4.0μm Comp TEOS | 4.0μm Comp TEOS | 2.0μm Tens TEOS | 4.0μm Comp TEOS | b)

| Layer | 1 | 2 | 3 | 4 | 5 | 6 | 7 | 8 | 9 | 10 | 11 | 12 |
|---|---|---|---|---|---|---|---|---|---|---|---|---|
| Film Type | 2.0μm Comp TEOS | 1.0μm Tens TEOS | 2.0μm Comp TEOS | 2.0μm Comp TEOS | 1.0μm Tens TEOS | 2.0μm Comp TEOS | 2.0μm Comp TEOS | 1.0μm Tens TEOS | 2.0μm Comp TEOS | 2.0μm Comp TEOS | 1.0μm Tens TEOS | 2.0μm Comp TEOS | c)

| Layer | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Film Type | 1.0μm Comp TEOS | 0.5μm Tens TEOS | 1.0μm Comp TEOS | 0.5μm Tens TEOS | 2.0μm Comp TEOS | 1.0μm Comp TEOS | 0.5μm Tens TEOS | 1.0μm Comp TEOS | 0.5μm Tens TEOS | 2.0μm Comp TEOS | 1.0μm Comp TEOS | 0.5μm Tens TEOS | 1.0μm Comp TEOS | 0.5μm Tens TEOS | 2.0μm Comp TEOS | 1.0μm Comp TEOS | 0.5μm Tens TEOS | 1.0μm Comp TEOS | 0.5μm Tens TEOS | 2.0μm Comp TEOS |

Fig. 3

| Layer | 1 | | 2 | | 3 | | 4 | | 5 | |
|---|---|---|---|---|---|---|---|---|---|---|
| Film Type | 1.0μm Comp TEOS | ~500A Graded Transition | 0.5μm Tens TEOS | ~500A Graded Transition | 1.0μm Comp TEOS | ~500A Graded Transition | 0.5μm Tens TEOS | ~500A Graded Transition | 2.0μm Comp TEOS | Chamber Etch back |

Fig. 5

SUBSTRATE

BACKGROUND

This invention relates to a substrate having a dielectric film thereon, methods of depositing the dielectric film on the substrate, and to associated devices.

Many devices are fabricated by building up multiple thin dielectric, semiconducting and metal layers on a substrate such as a silicon wafer. However, the deposition of these layers results in a build-up of stress. The net stress produced at each stage places constraints on subsequent process steps. For example, the net stress imparted can result in warpage of the wafer, which can ultimately result in wafer loss due to handling problems. A further problem is cracking of the layers which in turn results in a reduction in yield and wafer loss. The net stress that the wafer is subjected to may be a tensile stress or a compressive stress.

It is standard practice in semiconductor wafer fabrication to attempt to minimise wafer warpage. It is also standard practice to attempt to deposit layers without cracks. In order to minimise wafer warp, it is known to reduce the internal stress within a deposited film to an acceptable level by a treatment such as ion bombardment or process chemistry. Alternatively, layers may be selected to compensate for the stress in underlying films. For example, it is known to deposit a film which is subject to a compressive stress on top of a film that is subject to a tensile stress. However, these prior art techniques have their limitations. Typical methods employed to control stress within a film are the plasma conditions which influence net growth rate such as deposition rate and RF bias, the intrinsic properties of the material selected, deposition temperature and thickness of the film. However device design places constraints on many of these parameters and as a consequence of these constraints novel processes are required to deliver some new advanced devices.

Further problems are encountered in the manufacture of high power, high voltage capacitor devices. Devices of this kind commonly require polyimide to be integrated into the device. Whilst polyimide offers many benefits, there are some undesirable constraints associated with the use of this material. Typically, the thickness of the deposited polyimide film is limited to less than 10 microns. This in turns limits the voltage and hence the electric field that can be applied to the device. Also, polyimide has a relatively low thermal budget. The cure temperature of polyimide is 280° C. As a result, any dielectric isolating layers must be compatible with this temperature restraint. Effectively, this means that the temperature associated with the deposition of isolating layers should not exceed 280° C. Commonly, silicon dioxide is used as the isolating layer.

There is a requirement to operate future devices at higher voltages than can be achieved currently. It would be highly desirable to provide silicon dioxide isolation layers which have a thickness of 20 microns or greater in order to cope with the requirements of new devices that may utilise polyimide. However, it is currently not possible to deposit such thick, homogeneous layers of silicon dioxide at temperatures of 280° C. or lower. This is because the layers crack due to the build-up of stress in the film.

SUMMARY

The present invention, in at least some of its embodiments, addresses the problems and desires described above. In particular, the present invention, in at least some of its embodiments, provides thick silicon dioxide films which can be of greater than 20 microns thickness. The films can exhibit excellent electrical leakage and little or no cracking after the deposition. The films can be deposited with a zero associated stress, or with a desired stress which can be used to compensate for stresses exhibited elsewhere in a device.

According to a first aspect of the invention there is provided a substrate having a dielectric film thereon, in which: the dielectric film comprises at least four stacked layers of a dielectric material; the stacked layers comprise compressive layers which are subject to a compressive stress and tensile layers which are subject to a tensile stress; and there are at least two spaced apart tensile layers which are each adjacent to one or more compressive layers.

The dielectric film may have a thickness of 10 microns or more. Preferably, the dielectric film has a thickness of 15 microns or more. More preferably the dielectric film has a thickness of 20 microns or more. The relatively thick dielectric film which can be provided by the invention can be utilised as an isolating film in devices which are subject to high voltages.

The dielectric material may be silicon dioxide. However, other dielectric materials, such as other silicon oxides, might be utilised instead.

The dielectric film may comprise at least 10 layers of the dielectric material. Preferably, the dielectric film comprises at least 12 layers of the dielectric material. More preferably, the dielectric film comprises at least 15 layers of the dielectric material. More preferably still, the dielectric film comprises at least 20 layers of the dielectric material. Surprisingly, it has been found that the use of a relatively large number of layers can result in improved anti-cracking properties.

The layers of the dielectric film may each have a thickness in the range 0.3 to 5 microns. Preferably, the thickness of the layers of the dielectric film are each in the range 0.3 to 2.5 microns.

The tensile layers may each have a thickness in the range 0.3 to 1.5 microns.

The tensile layers may each have a thickness of 1.0 micron or less.

The substrate may comprise a polyimide layer. The dielectric film may be deposited onto the polyimide layer. The polyimide layer may be disposed on a semiconductor wafer such as a silicon wafer.

The substrate may form part of a device or a precursor of a device which comprises at least one semiconductor component. The substrate may comprise a semiconductor wafer, such as a silicon wafer. The dielectric film may be deposited directly onto the semiconductor wafer. Alternatively, the dielectric layer may be deposited onto an additional element of the substrate, such as a dielectric, semiconductor or metallic layer. In some embodiments, the additional element may be a polyimide layer or another polymeric layer.

The dielectric film may comprise at least three tensile layers. Preferably, the dielectric device comprises at least four tensile layers. More preferably, the dielectric device comprises at least eight tensile layers. It has been found that dielectric films which comprise a relatively large number of layers, including a relatively large number of tensile layers, can exhibit excellent anti-cracking properties, particularly when the layers are relatively thin. Layers having a thickness of 2.5 microns or less may be considered to be relatively thin.

At least some adjacent compressive and tensile layers may be separated by a transitional zone of the dielectric material. In some embodiments, all adjacent compressive and tensile layers separated by a transitional zone of the dielectric material. The transitional zone may be subject to variable stresses which vary from a region of the transitional zone contacting a tensile layer, which region is subject to a tensile stress, to a region of the transitional zone contacting a compressive layer, which region is subject to a compressive stress. The use of transitional zones between adjacent compressive and tensile layers can result in further improvements in anti-cracking properties. The average stress that a transitional zone is subject to may be zero or close to zero.

The transition zones may have a thickness in the range 20-100 nm. Preferably, the transition zones have a thickness in the range of 30-75 nm. Most preferably, the transitional zones have a thickness of about 50 nm.

The layer which is in direct contact with the substrate and the uppermost layer of the film may be compressive layers. At least half of the layers may be subject to a stress having a modulus which is greater than 25 MPa. It will be understood that this means that the layer may be a tensile layer which is subject to a stress which is greater than +25 MPa, or a compressive layer which is subject to a compressive stress which is greater than 25 MPa, i.e., a stress which is more negative than −25 MPa. At least half of the layers may be subject to a stress having a modulus which is greater than 90 MPa. At least half of the layers may be subject to a stress having a modulus which is greater than 120 MPa. At least half of the layers may be subject to a stress having a modulus of about 150 MPa.

In some embodiments, at least 90% of the layers are subject to a stress having a modulus which is greater than 25 MPa, preferably greater than 90 MPa, more preferably greater than 120 MPa, most preferably about 150 MPa. Surprisingly, it has been found that dielectric films made up of layers which are subject to relatively high stresses have improved properties, such as improved anti-cracking properties. This is surprising because, in these embodiments, there can be a relatively high stress differential between adjacent compressive and tensile layers.

The dielectric film may have a zero net stress. Alternatively, the dielectric film may be subject to a net stress which at least partially compensates for a bow in the substrate. It is advantageous that the invention can provide a dielectric film which is subject to a desired net stress depending on the desired application.

The dielectric film may be subject to a net stress having a modulus which is less than 100 MPa. The dielectric film may be subject to a net stress having a modulus which is less than 60 MPa.

The dielectric film may be subject to a net compressive stress. Alternatively, the dielectric film may be subject to a net tensile stress.

According to a second aspect of the invention there is provided a method of depositing a dielectric film on a substrate comprising the steps of:

depositing a layer of a dielectric material on the substrate; and depositing at least a further three layers of the dielectric material to provide a dielectric film comprising at least four stacked layers of the dielectric material;

in which the stacked layers comprise compressive layers which are subject to a compressive stress and tensile layers which are subject to a tensile stress, and the layers are deposited so that there are at least two spaced apart tensile layers which are each adjacent to one or more compressive layers.

The layers may be deposited so that the dielectric film has a thickness of 10 microns or more. The layers may be deposited so that the dielectric film has a thickness of 15 microns or more. The layers may be deposited so that the dielectric film has a thickness of 20 microns or more.

The dielectric material may be silicon dioxide.

A subset of the layers may be deposited in a chamber. Following deposition of the substrate and the layers, a chamber etch back step may be performed. At least one further subset of the layers may be deposited. The deposition of a further subset of the layers may be followed by a further chamber etch back step.

Each subset of the layers may be a stack having a lower layer, an upper layer, and at least one layer intermediate the upper and lower layers. The upper and lower layers may be compressive layers. In this way, the subset may comprise tensile layers which are encapsulated within compressive layers. This can assist in ensuring that back to back depositions are subject to essentially the same stress. A further benefit is that film mismatch can be prevented or at least reduced. The subset of the layers may be of any suitable thickness, although thicknesses in the range 3 to 7 microns have been found to work well in practice.

The layers may be deposited at a deposition temperature of less than 280° C. This is a substantial advantage provided by the present invention. It enables dielectric films to be deposited on materials such as polyimide which have a relatively low thermal budget.

The layers may be deposited in a single chamber. This is highly advantageous, because it reduces the complexity of the manufacturing process.

The layers may be deposited using a single deposition process. Again, this is advantageous since it reduces the complexity of the manufacturing process.

In some embodiments, the dielectric material with silicon dioxide, and the steps of depositing the layers are performed in a PE-CVD process. The PE-CVD process may use TEOS and $O_2$ or an oxygen containing species as precursors. The PE-CVD process may be performed using a plurality of RF frequencies to create a plasma. Typically, dual RF frequencies are used.

Advantageously, it has been found that both the compressive and tensile layers can be deposited during a single PE-CVD process through relatively straightforward variation of the process parameters. For example, process parameters associated with the plurality of RF frequencies may be varied. Transitional zones may also be provided through variation of the PE-CVD process parameters.

According to a third aspect of the invention there is provided a device comprising a substrate of the first aspect of the invention. The device may comprise at least one semiconductor component. The semiconductor component may be a semiconductor wafer. Other semiconductor components, such as other semiconductor layers, may be provided.

The device may comprise one or more metal layers.

The device may be a capacitor device. Alternatively, the device may be another electrical device and/or energy storage device. The device may be a high voltage device.

Whilst the invention has been described above, it extends to any inventive combination of the features set out above, or in the following description, drawings or claims. For example, any feature described in relation to one aspect of the invention is considered to be disclosed also in relation to another aspect of the invention.

BRIEF DESCRIPTION OF THE DRAWINGS

Embodiments of substrates, films and methods in accordance with the invention will now be described with reference to the accompanying drawings, in which:—

FIG. 2 shows bow maps of a silicon wafer (a) before deposition and (b) after deposition of a dielectric film on a polyimide coating;

FIG. 3 is a schematic diagram showing (a) a six layer dielectric film together with an image showing cracking of the film (b) a 12 layer dielectric film together with an image showing cracking of the film and (c) a 20 layer dielectric film;

FIG. 5 is a schematic diagram of a subset of silicon dioxide layers.

DETAILED DESCRIPTION

The invention provides dielectric films which are made up of a plurality of layers. At least some of the adjacent layers in the film are subject to alternating stresses, i.e., compressive and tensile stresses. By judicious choice of the process parameters utilised in depositing the dielectric film, it is possible to avoid adding any stress to the substrate or structure on which the dielectric film was deposited. Alternatively, it is possible to alter the overall stress which the substrate or structure together with the dielectric film is subject to. Typically, this is done to reduce the overall stress.

The invention can be applied to a wide range of dielectric films which can be deposited on a wide range of substrates. The substrate on which the dielectric film is deposited can form part of a larger structure. Again, the invention can be utilised with a wide range of structures. An advantage of the invention is that it enables the deposition of relatively thick dielectric films, i.e., films having a thickness of 20 microns or greater. However, the skilled person will appreciate that the invention can be used to deposit thinner films, of thicknesses less than 20 microns. However, it is highly advantageous that films having a thickness of greater than 20 microns can be deposited using the invention with enhanced resistance to cracking. Representative, but non-limiting, embodiments of the invention will now be described in which a silicon dioxide dielectric film is deposited on a polyimide coated substrate. This polyimide coated substrate may form part of a structure which comprises an underlying silicon wafer.

Figure 1:
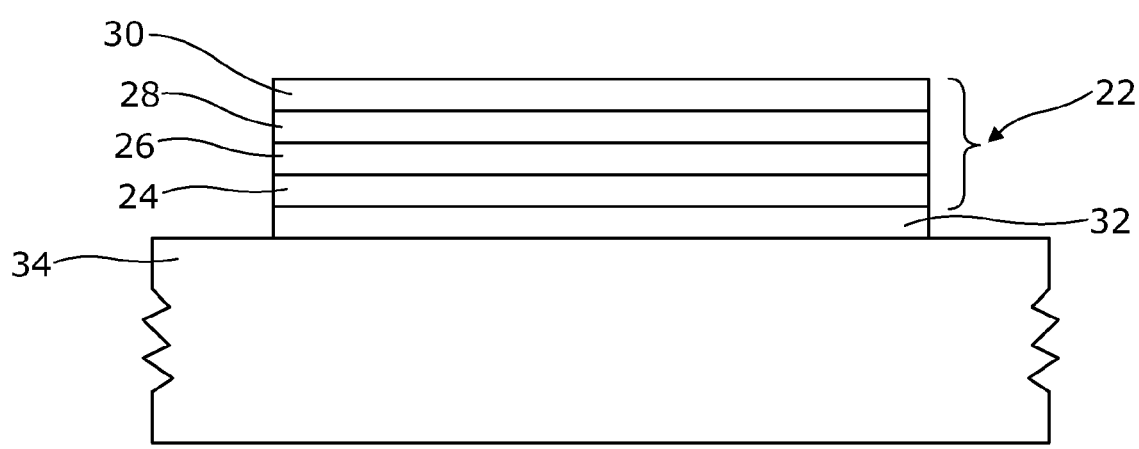
FIG. 1 shows a four layer dielectric film on a polyimide film/silicon wafer.

FIG. 1 shows a 10 micron thick silicon dioxide film, depicted generally at 22, made up of four separately deposited layers 24, 26, 28, 30 of silicon dioxide. The film 22 is deposited onto a polyimide coating 32 on a silicon wafer 34. The overall thickness of the silicon dioxide film 22 is 10 microns, and the thicknesses of the individual layers 24, 26, 28, 30 are 2.25, 2.75, 2.25, and 2.75 microns, respectively. The layers 24, 28 are subject to a tensile stress, whereas the layers 26, 30 are subject to a compressive stress. The overall stress that the film 22 is subject to is +1.84 MPa, i.e., the film 22 is subject to a tensile stress. Prior to deposition of the film 22, the wafer 34 and polyimide film 32 had a bow of +57.53 microns. After deposition of the silicon dioxide film, the bow was reduced to +39.87 microns.

In another embodiment, another 10 micron thick silicon dioxide film was deposited onto a polyimide substrate on a silicon wafer. In this second embodiment, the first and third deposited layers were each four micron thick layers subject to a compressive stress. The second and fourth deposited layers were two micron thick layers subject to a tensile stress. The dielectric film comprising the stack of four silicon dioxide layers was subject to a net stress of −52 MPa.

Prior to the deposition of the dielectric film, the polyimide substrate and silicon wafer had a bow of 47.61 microns (tensile stress). After deposition of the dielectric film, this bow was reduced to 40.45 microns. FIG. 2 shows bow maps of the wafer (a) prior to and (b) after the dielectric film deposition.

TABLE 1

Cracking Threshold vs ΔStress Value

| Stack | Tensile Stress | Compressive Stress | Net Stack Stress | Cracking Threshold |
|---|---|---|---|---|
| Low Compressive Stress only | n/a | −30 MPa | −30 MPa | <10 μm |
| Stacked Medium Stress | +100 | −100 | −30 MPa | ~15 μm |
| Stacked High Stress | +150 | −150 | −30 MPa | ~18 μm |

Surprisingly, it has been found that better results could be achieved by depositing layers which are subject to relatively high tensile and compressive stresses. Table 1 describes three categories of films. In each case, a silicon dioxide dielectric film was produced which was subject to a net stress of −30 MPa. The "low compressive stress" film was produced by depositing layers which are each subject to relatively low tensile or compressive stresses (−30 MPa for layers under a compressive stress). "Medium stress" films are produced by depositing layers which are under a stress of either +100 or −100 MPa. "High stress" films were produced by depositing layers which are under a stress of either +150 or −150 MPa. It can be seen that "high stress" films have a significantly improved cracking threshold. The cracking threshold is the maximum thickness of the dielectric film which can be deposited without the film being subject to cracking. It will appreciated that with the "high stress" film, there is a relatively high variation in stress where a layer subject to a compressive stress is adjacent to a layer subject to a tensile stress. However, these embodiments enable considerably thicker films to be deposited.

Further improvements can be obtained by reducing the thickness of the individual deposited layers in the stack which makes up the dielectric film. In other words, for a given film thickness, improvements can be obtained by increasing the number of deposited layers. FIG. 3(*a*) to (*c*) depict three silicon dioxide films each of 20 micron thickness. Each layer is numbered. Layer 1 is the layer which is deposited onto the substrate. In all of the embodiments described in FIG. 3, the deposited layers are subject to either a tensile stress of +150 MPa or a compressive stress of −150 MPa. In FIGS. 3 and 5, the term "Comp" means a layer subject to a compressive stress, and the term "Tens" means a layer subject to a tensile stress. In FIG. 3(*a*) a silicon dioxide film is deposited using six layers. Four of the layers are subject to a compressive stress, and two of the layers are subject to a tensile stress. Relatively thick layers are used (the "compressive" layers are four microns thick, and the "tensile" layers are two microns thick). The 20 micron thick silicon dioxide film produced using six layers is subject to significant cracking. FIG. 3(*b*) shows a silicon dioxide film made up of 12 layers of reduced thickness. More particularly, the film is made up of eight "compressive" layers of two microns thickness and four "tensile" layers of one micron thickness. Substantially reduced cracking is observed. In FIG. 3(*c*) a silicon dioxide film was produced using 20 layers. More particularly, the silicon film comprises 12 "compressive" layers of either one or two microns thickness, and eight "tensile" layers of 0.5 micron thickness.

This resulted in a 20 micron thick silicon dioxide film which is free of cracks. From this we conclude that improved results can be obtained through depositing a relatively large number of relatively thin layers which are subject to relatively high stresses.

Yet further improvements can be obtained by grading the deposition process so that relatively thin transitions zones are formed between adjacent "compressive" and "tensile" layers. The internal stresses that the transitional zones are subject to are graded through the transitional zones. The region of the transitional zone which is in contact with a "tensile" layer is believed to be subject to a stress which is similar or identical to the stress that the "tensile" layer is subjected to. Similarly, the region of a transitional zone which is in contact with a "compressive" layer is believed to be subject to a compressive stress which is similar or identical to the stress which the "compressive" layer is subject to. It is believed that the transitional zones are subject to a low net stress. Without wishing to be bound by any particular theory or conjecture, it is believed that the improved results obtained using the transitional zones may be due to the elimination of a mismatch in stress between successive depositions of layers in the dielectric film. By using dielectric films which incorporate transitional zones between adjacent "tensile" and "compressive" layers, dielectric films having thicknesses of greater than 20 microns can be produced with excellent properties such as low or no cracking.

Figure 4:
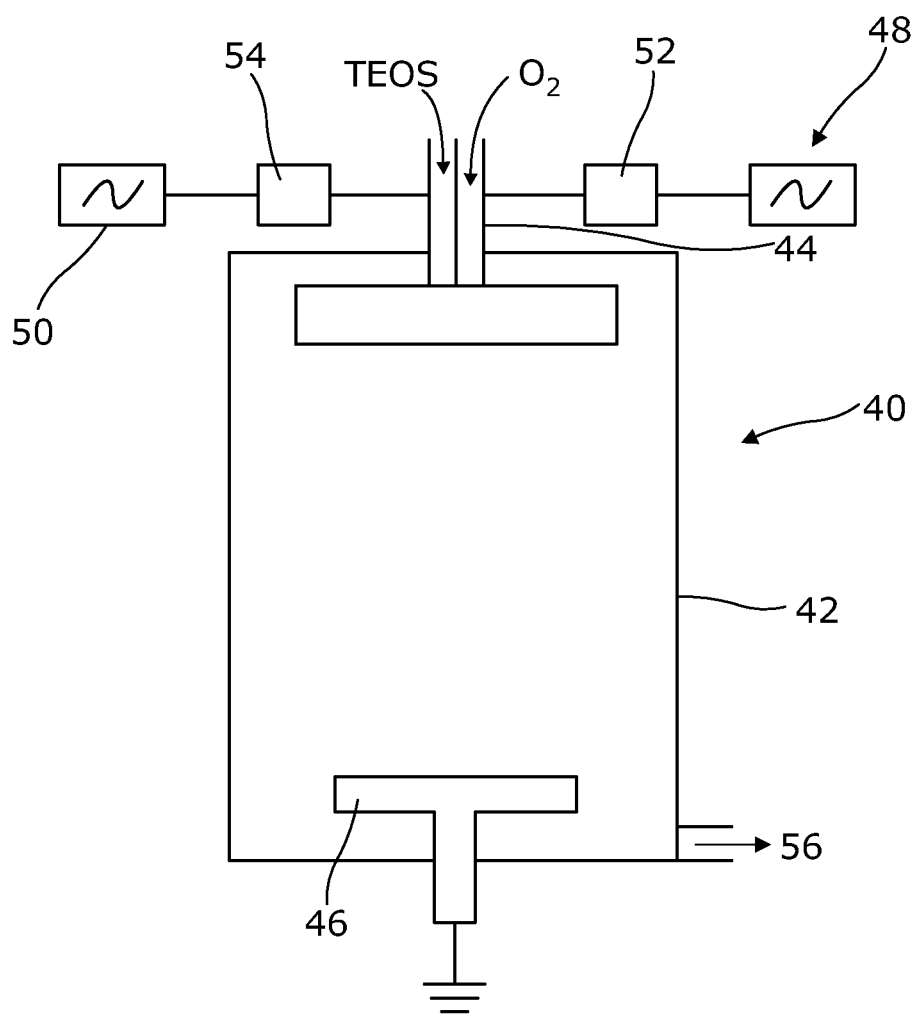
FIG. 4 shows PE-CVD apparatus for depositing dielectric films.

Silicon dioxide films of the invention can be produced using plasma enhanced chemical vapour deposition (PE-CVD). PE-CVD using a mixture of TEOS and $O_2$ (or an oxygen containing precursor) is a convenient way of preparing films of the invention. FIG. 4 is a schematic diagram of apparatus, depicted generally at 40, which is suitable for depositing films of the invention. The apparatus 40 comprises a chamber 42, a gas inlet 44 in the form of a showerhead arrangement, a wafer support 46, and respective high and low frequency RF sources 48, 50. The showerhead 44 is arranged to receive the TEOS and oxygen precursor gases. RF matching units 52, 54 are provided for the high and low frequency RF sources 48, 50 respectively. Process gases are exhausted from the chamber 42 through an outlet 56 which is connected to a pumping arrangement (not shown). Table 2 shows representative deposition conditions for producing both films which are subject to a compressive stress and films which are subject to a tensile stress. It is extremely convenient that both types of film can be easily deposited in the same chamber using a common process simply through judicious variation of the process conditions. The transitional zones can be produced by running the RF power continuously and varying the process parameters between those associated with a "compressive" layer and those associated with a "tensile" layer and vice versa. The changeover between process conditions can take place over about 5 seconds, and this gives rise to transition zones having a thickness of about 50 nm.

TABLE 2

Representative deposition conditions

|  | Compressive stress TEOS | Tensile Stress TEOS |
| --- | --- | --- |
| Pressure (mT) | 3100 | 3100 |
| O2 (sccm) | 2300 | 2300 |
| H2 (sccm) | 1000 | 1000 |
| TEOS flow (ccm) | 1.5 | 1.6 |
| RF HF (Watts) 13.65 MHz | 900 | 800 |
| RF LF (Watts) 500 kHz | 475 | 165 |

It is convenient to build up the dielectric film by depositing a number of sequential "sub-stacks" of layers. After a sub-stack is deposited, a chamber etch back step can be performed. FIG. 5 shows a representative sub-stack which is made up of a one micron thick "compressive" layer, a 0.5 micron thick "tensile" layer, a one micron thick "compressive" layer, a 0.5 micron thick "tensile" layer and a two micron thick "compressive" layer. Each layer is numbered. Layer 1 is the layer which is deposited onto the substrate. Each pair of adjacent layers are separated by a transitional zone of approximately 50 nm thickness. After deposition of this sub-stack a chamber etch back step can be performed. This enables the dielectric film to be built up as a stack which is made from approximately five micron thick sections comprising a number of sub-stacks. Each sub-stack comprises "tensile" layers which are encapsulated between "compressive" layers. This ensures that back to back depositions are of the same stress, and prevent film mismatch. Without wishing to be bound by any particular theory or conjecture, it is believed that the transitional zones take up some of the forces applied by the opposing stresses associated with the "tensile" and "compressive" films during wafer cool down after the deposition process.

What is claimed is:

1. A substrate having a dielectric film thereon, in which: the dielectric film comprises at least four stacked layers of a dielectric material; the stacked layers comprise compressive layers which are subject to a compressive stress, and tensile layers which are subject to a tensile stress; and there are at least two spaced apart tensile layers which are each adjacent to one or more compressive layers wherein the dielectric material is silicon dioxide; and wherein at least some adjacent compressive and tensile layers are separated by a transitional zone of the dielectric material, in which the transitional zone is subject to variable stresses which vary from a region of the transitional zone contacting a tensile layer, which region is subject to a tensile stress, to a region of the transitional zone contacting a compressive layer, which region is subject to a compressive stress.

2. The substrate according to claim 1 in which the dielectric film has a thickness of 10 microns or more, preferably 15 microns or more, more preferably 20 microns or more.

3. The substrate according to claim 1 in which the dielectric film comprises at least 10 layers of the dielectric material.

4. A substrate according to claim 3, in which the dielectric film comprises at least 12 layers of the dielectric material.

5. A substrate according to claim 4 in which the dielectric film comprises at least 15 layers of the dielectric material, and preferably comprises at least 20 layers of the dielectric material.

6. A substrate according to claim 1 in which the dielectric layers of the dielectric film each have a thickness in the range of 0.3 to 5 microns, preferably in the range 0.3 to 2.5 microns.

7. A substrate according to claim 1 comprising a polyimide layer, in which the dielectric film is deposited onto the polyimide layer.

8. A substrate according to claim 1 in which the substrate forms part of a device or a precursor of a device which comprises at least one semiconductor component.

9. The substrate according to claim 1 in which the dielectric film comprises at least three, preferably at least four, more preferably at least eight tensile layers.

10. The substrate according to claim 1 in which the transitional zones have a thickness in the range 20-100 nm, preferably 30-75 nm, most preferably about 50 nm.

11. A substrate according to claim 1 in which a layer in direct contact with the substrate and an uppermost layer of the film are compressive layers.

12. A substrate according to claim 1 in which at least half of the layers, preferably at least 90% of the layers, are subject to a stress having a modulus which is greater than 25 MPa, preferably greater than 90 MPa, more preferably greater than 120 MPa, most preferably about 150 MPa.

13. A substrate according to claim 1 in which the dielectric film is subject to a net stress which at least partially compensates for a bow in the substrate.

14. A substrate according to claim 1 in which the dielectric film is subject to a net stress having a modulus which is less than 100 MPa, preferably less than 60 MPa.

15. The substrate according to claim 14 in which the dielectric film is subject to a net compressive stress.

16. A device comprising a substrate according to claim 1.

17. The device according to claim 16 which is a capacitor device.

18. A method of depositing a dielectric film on a substrate comprising the steps of:
depositing a layer of a dielectric material on the substrate; and
depositing at least a further three layers of the dielectric material to provide a dielectric film comprising at least four stacked layers of the dielectric material;
in which the stacked layers comprise compressive layers which are subject to a compressive stress and tensile stress layers which are subject to a tensile stress, and the layers are deposited so that there are at least two spaced apart tensile layers which are each adjacent to one or more compressive layers wherein the dielectric material is silicon dioxide; and wherein at least some adjacent compressive and tensile layers are separated by a transitional zone of the dielectric material, in which the transitional zone is subject to variable stresses which vary from a region of the transitional zone contacting a tensile layer, which region is subject to a tensile stress, to a region of the transitional zone contacting a compressive layer, which region is subject to a compressive stress.

19. The method according to claim 18 in which the layers are deposited so that the dielectric film has a thickness of 10 microns or more, preferably 15 microns or more, more preferably 20 microns or more.

20. The method according to claim 18 in which: a subset the layers are deposited in a chamber; following deposition of the subset of the layers a chamber or etch back step is performed; and at least one further subset of the layers is deposited.

21. The method according to claim 20 in which each subset of the layers is a stack having a lower layer, an upper layer and at least one layer intermediate to upper and lower layers, wherein the upper and lower layers are compressive layers.

22. The method according to claim 18 in which the layers are deposited at a deposition temperature of less than 280° C.

23. The method according to claim 18 in which layers are deposited in a single chamber.

24. The method according to claim 18 in which the layers are deposited using a single deposition process.

25. The method according to claim 18 in which the dielectric material is silicon dioxide and the steps of depositing the layers are performed in a PE-CVD process using TEOS and $O_2$ or an oxygen containing species as precursors.

26. The method according to claim 25 in which the PE-CVD process is performed using a plurality of RF frequencies to create a plasma, preferably using dual RF frequencies.

* * * * *